United States Patent [19]

Zambrano

[11] Patent Number: 5,773,899
[45] Date of Patent: Jun. 30, 1998

[54] BONDING PAD FOR A SEMICONDUCTOR CHIP

[75] Inventor: Raffaele Zambrano, San Giovanni La Punta, Italy

[73] Assignee: Consorzio per la Ricerca sulla Microelettronica nel Mezzogiorno, Catania, Italy

[21] Appl. No.: 705,921

[22] Filed: Aug. 29, 1996

Related U.S. Application Data

[60] Continuation of Ser. No. 462,180, Jun. 5, 1995, abandoned, which is a division of Ser. No. 306,455, Sep. 15, 1994, abandoned.

[30] Foreign Application Priority Data

Sep. 30, 1993 [EP] European Pat. Off. ............ 93830396

[51] Int. Cl.[6] ........................ H01L 23/48; H01L 29/43; H01L 29/784
[52] U.S. Cl. .................... 257/784; 257/786; 257/734; 257/341
[58] Field of Search ............................. 257/784, 786, 257/734, 781, 780, 341

[56] References Cited

U.S. PATENT DOCUMENTS

| | | | |
|---|---|---|---|
| 4,017,886 | 4/1977 | Tomono et al. | 257/643 |
| 4,606,998 | 8/1986 | Clodgo et al. | 430/312 |
| 4,663,820 | 5/1987 | Ionescu | 29/590 |
| 4,723,197 | 2/1988 | Takiar et al. | 257/643 |
| 4,878,099 | 10/1989 | Nilarp | 257/747 |
| 4,914,054 | 4/1990 | Moriyama et al. | 437/183 |
| 4,965,173 | 10/1990 | Gould | 430/317 |
| 4,984,061 | 1/1991 | Matsumoto | 257/784 |
| 5,110,408 | 5/1992 | Fujii et al. | 156/643 |
| 5,266,446 | 11/1993 | Chang et al. | 430/134 |
| 5,284,797 | 2/1994 | Heim | 437/183 |
| 5,539,244 | 7/1996 | Mori et al. | 257/784 |

FOREIGN PATENT DOCUMENTS

| | | | |
|---|---|---|---|
| EP-A-0339871 | 11/1989 | European Pat. Off. | H01L 23/48 |
| 4408557 | 9/1994 | Germany . | |
| A-5740942 | 3/1982 | Japan | H01L 21/60 |
| A-5740943 | 3/1982 | Japan | H01L 21/60 |
| A-58199533 | 11/1983 | Japan | H01L 21/60 |
| A-5935437 | 2/1984 | Japan | H01L 21/60 |
| A-63250142 | 10/1988 | Japan | H01L 21/60 |
| A-642339 | 1/1989 | Japan | H01L 21/92 |
| A-274040 | 3/1990 | Japan | H01L 21/32 |
| 0024731 | 2/1991 | Japan . | |
| A-324731 | 2/1991 | Japan | H01L 21/32 |
| A-462855 | 2/1992 | Japan | H01L 21/60 |
| WO-A-8201102 | 4/1982 | WIPO | H01L 23/48 |

OTHER PUBLICATIONS

Patent Abstracts of Japan, vol. 13, No. 62 (E–715) Feb. 13, 1989.
Patent Abstracts of Japan, vol. 8, No. 44 (E–229) Feb. 25, 1984, JP58199533.
European Search Report from European Patent Application No. 93830396.3.

*Primary Examiner*—Tom Thomas
*Assistant Examiner*—Alexander Oscar Williams
*Attorney, Agent, or Firm*—Wolf, Greenfield & Sacks, P.C.

[57] ABSTRACT

Disclosed is a bonding pad for a semiconductor chip which prevents damage during a bonding process. In a semiconductor chip having conductive regions interconnected by a metal pattern, a metal region is disposed over the metal pattern. The metal region forms a bonding pad area over the conductive regions. In addition, the metal region is in direct contact with the metal pattern for substantially the whole bonding pad area. With this arrangement, the metal region absorbs mechanical stress induced when a bonding wire is bonded to the metal region during a bonding process. The metal region is sufficiently thick so as not to be perforated during the bonding process and the metal pattern is, therefore, not damaged.

6 Claims, 4 Drawing Sheets

BONDING PAD FOR A SEMICONDUCTOR CHIP

This application is a continuation of application Ser. No. 08/462,180, filed Jun. 5, 1995, entitled A BONDING PAD FOR A SEMICONDUCTOR CHIP, now abandoned, which was a division of application Ser. No. 08/306,455, filed Sep. 15, 1994, entitled METALLIZATION AND BONDING PROCESS FOR MANUFACTURING POWER SEMICONDUCTOR DEVICES, now abandoned.

BACKGROUND OF THE INVENTION

1. Field of the Invention

The present invention relates to a metallization and bonding process for manufacturing power semiconductor devices.

2. Discussion of the Related Art

In the last few years, a fast technological evolution in the field of power semiconductor devices has made available, among other things, power MOSFETs with low "on" resistance (RDS(on)) and Power Integrated Circuits (PICs) for performing complex functions and capable of switching rather high power values.

PICs are characterized by high component counts, i.e., a high integration density; the metal layers should therefore allow for a high interconnection density and introduce low series resistance. Because these two requirements conflict, a trade off value for the thickness of the metal layer must be found. Such thickness values are generally so low that dedicated areas on the die surface, distinct from the active areas where the various components are defined, have to be reserved for the attachment (bonding) of leads to the die, because otherwise the leads could perforate the metal layer and damage the underlying integrated circuit. As a result the device area increases, and parasitic resistances due to the necessity of long interconnection lines between the active area and the bonding region are introduced.

Power MOSFETs are less sensitive to integration density problems, but it is extremely important to minimize all parasitic resistances so that low values of the $R_{DS(on)}$ may be attained, by bonding the leads directly on the active area. To prevent the bonding wires from perforating the metallization, this layer should have a rather high thickness, typically greater than 3 $\mu$m. Such a thick layer results in problems in both manufacturing and reliability, because the step coverage characteristics of a layer by a superimposed layer gets worse as the step height increases.

To prevent damage in the bonding process, the maximum diameter of a bonding wire is generally determined by the metallization layer thickness. To avoid the parasitic resistance of the bonding wire from affecting the MOSFET $R_{DS(on)}$, it is possible to bond in parallel two or more wires of smaller diameter, but at an increased cost.

SUMMARY OF THE INVENTION

In view of the state of art just described, an object of the present invention is to provide a process for the metallization and bonding of leads to a power semiconductor device, which is not affected by the abovementioned drawbacks.

According to the present invention, such object is attained by means of a metallization and bonding process for manufacturing a power semiconductor device, including the following steps:

(a) depositing a first metal layer over the entire surface of a chip;

(b) selectively etching the first metal layer to form a desired pattern of metal interconnection lines between components previously defined;

(c) depositing a layer of passivating material over the entire surface of the chip;

(d) selectively etching the layer of passivating material down to the first metal layer to define bonding areas represented by uncovered portions of the first metal layer;

(e) depositing a thick second metal layer over the entire surface of the chip;

(f) selectively etching the second metal layer down to the layer of passivating material to remove the second metal layer outside said bonding areas; and (g) connecting bonding wires to the surface of the second metal layer at said bonding areas.

The thickness of the first metal layer can be chosen according to the required degree of integration and is not imposed by bonding requirements. The second metal layer is generally thicker than, but can also have the same thickness as, the first metal layer; the thickness of the second metal layer shall be sufficient to prevent its perforation by the bonding wires during the bonding step.

According to the present invention, it is possible to perform the bonding to a PIC chip directly over the active area of the semiconductor substrate where the integrated components are obtained, because the overall metallization thickness is at least twice the thickness of the metal interconnection lines. This allows a significant reduction in the chip area, because no dedicated space for bonding is required, and this eliminates all the parasitic resistances which would otherwise be present, if interconnection lines from the active area to a dedicated bonding area were used.

As far as power MOSFETs are concerned, because the total metallization thickness in the bonding regions is the sum of the thickness of the first and the second metal layers, bonding wires of greater diameter can be used. Their low parasitic resistance does not increase significantly the $R_{DS(on)}$ of the device.

With respect to a conventional single metal layer metallization process, the only additional cost is represented by the deposition and definition steps of the second metal layer (i.e., steps e) and f)).

BRIEF DESCRIPTION OF THE DRAWINGS

The features of the present invention shall be made more evident by the following detailed description of three particular embodiments, illustrated as non-limiting examples in the annexed drawings, wherein.

DETAILED DESCRIPTION

Figure 1:
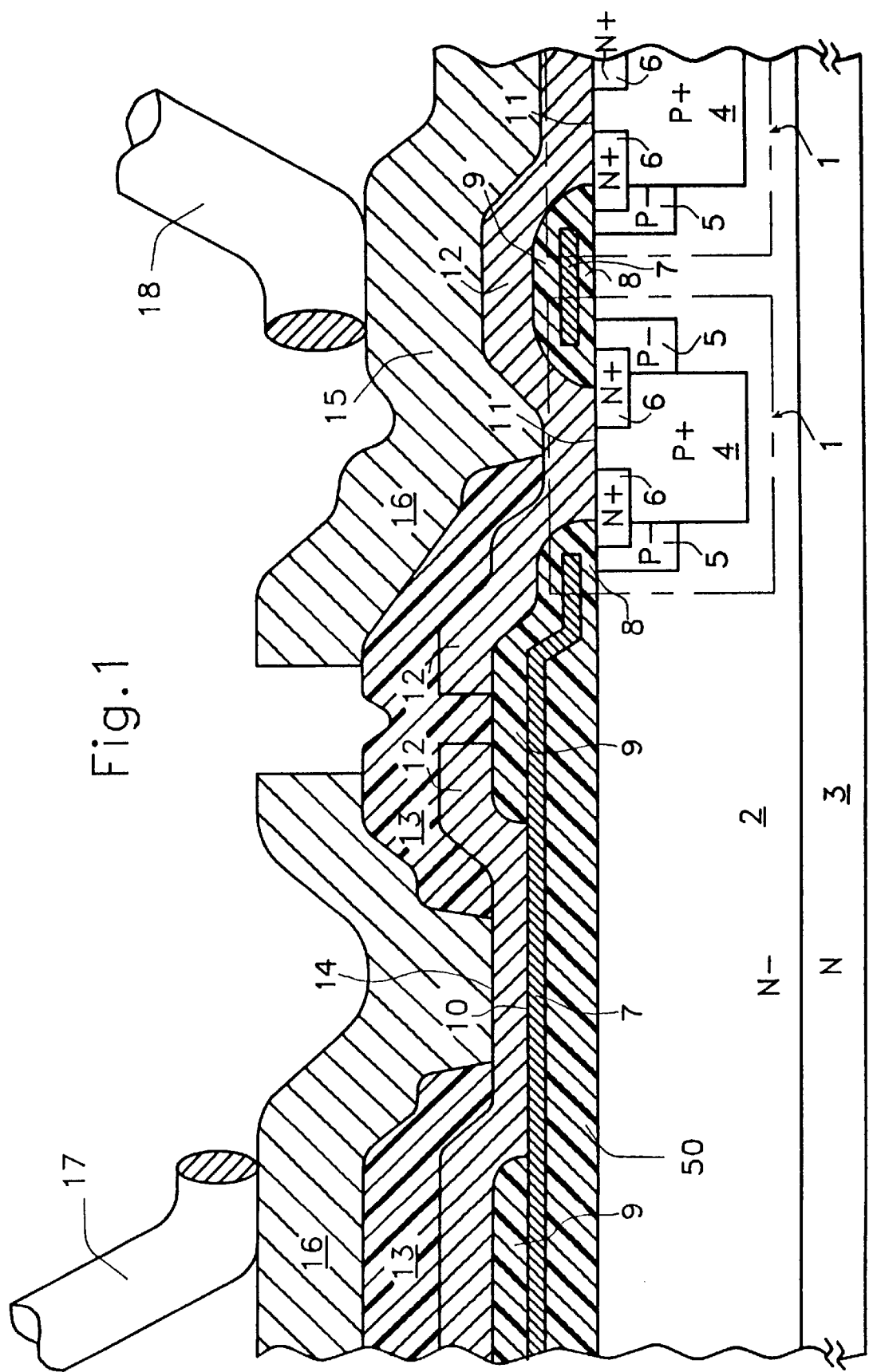
FIG. 1 is a cross-sectional view of a power MOSFET in which metallization and bonding have been carried out with a process according to the invention.

With reference to FIG. 1, an N-channel power MOSFET is commonly made up of a plurality of elementary cells 1, obtained in an active area region represented by a lightly doped N type epitaxial layer 2, grown over an N type semiconductor substrate 3. Each cell 1 includes a heavily doped P type body region 4, around which a lightly doped P type annular region 5 is provided, and a heavily doped N type annular region 6 which extends laterally from inside the body region 4 into the P type annular region 5. The N type annular region 6 represents a source region of the elementary cell 1, and the P type annular region 5 is a channel region. A polysilicon layer 7 provides the gate electrode of each of the elementary cells 1. The polysilicon layer 7 is isolated from the semiconductor surface by a thin gate oxide layer 8 in the active areas and by a thicker field oxide layer 50 elsewhere.

The polysilicon layer 7 is covered by a dielectric layer 9, made, for example, of silicon dioxide and phosphosilicate glass. Contact areas 10 and 11 are provided to allow a superimposed first metal layer 12 to contact respectively the polysilicon layer 7 and the surface of the semiconductor in correspondence to each elementary cell 1. The first metal layer 12 can be for example an aluminium-silicon alloy, but different alloys, such as above mentioned or Al-Si-Ti, could be utilized.

The first metal layer 12, once selectively etched, defines a pattern of interconnection lines between the elementary cells 1.

The first metal layer 12 is covered by a layer 13 of passivating material, such as a phosphosilicate glass, which is selectively removed at bonding areas 14 and 15 to allow a superimposed second metal layer 16 to contact the first metal layer 12. The second metal layer 16 has the same composition of, but is thicker than, the first metal layer 12, in order not to damage the elementary cells 1 during the bonding of wires 17 and 18.

The wire 17 has a smaller diameter than the wire 18 because the current flowing through it (i.e., the MOSFET gate current) is much lower than the current flowing through the wire 18 (i.e., the MOSFET source current).

A sequence of steps for manufacturing the power MOSFET of FIG. 1 according to the process of the present invention is depicted in FIGS. 4 to 7 in which all the steps up to the deposition and definition of the first metal layer 12 (FIG. 4) have not been shown but are totally conventional.

Figure 6:
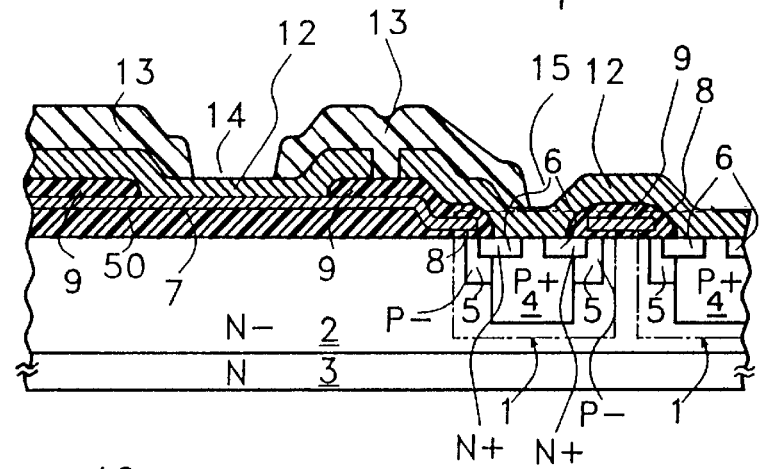

The layer 13 of passivating material is deposited over the entire surface of the chip (FIG. 5) and is then selectively etched to obtain uncovered portions 14 and 15 of the first metal layer 12 (FIG. 6).

Figure 7:
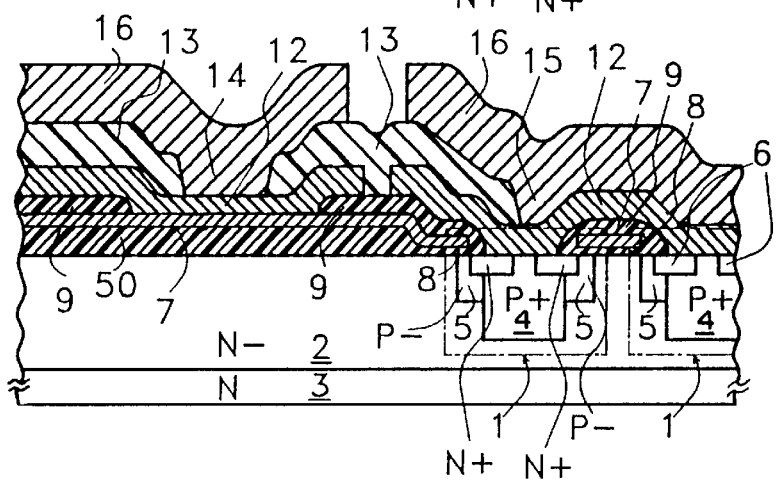

The second metal layer 16 is deposited over the entire surface of the chip and is successively etched (FIG. 7).

The subsequent attachment of the bonding wires 17 and 18 leads to the structure of FIG. 1. No additional passivating layers are necessary, since the surface of the semiconductor is already protected by the layer 13.

The process according to the invention, which has just been described with reference to the fabrication of a power MOSFET, can also be used to obtain different power devices, for example, Power Integrated Circuits (PICs).

Figure 2:
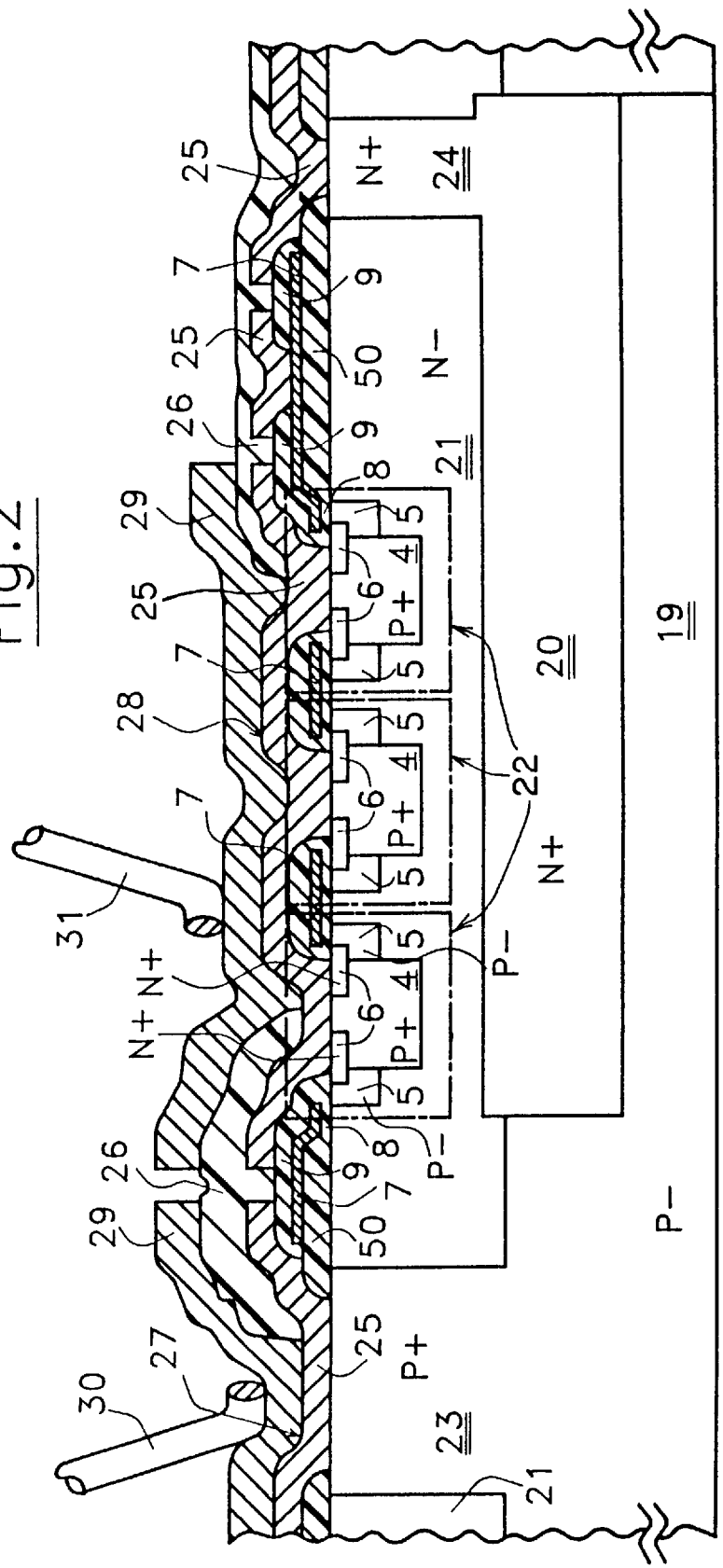
FIG. 2 is a cross-sectional view of a Power Integrated Circuit wherein metallization and bonding have similarly been carried out accordingly to the invention.

FIG. 2 shows the cross-section of a typical PIC. A heavily doped N type buried layer 20 is implanted into a lightly doped P type substrate 19, and a lightly doped N type epitaxial layer 21 is grown over the surface of the substrate 19. The epitaxial layer 21 represents an active area region in which various integrated components are obtained, such as three elementary cells 22 of a power MOSFET.

Heavily doped P type and N type regions 23 and 24 are obtained by implantation into the epitaxial layer 21 and allow the formation of contacts to the P type substrate 19 and to the buried layer 20, respectively.

The elementary cells 22 are identical to the already described elementary cells 1 of FIG. 1.

A first metal layer 25, properly patterned by selective etching, contacts each of the cells 22, their polysilicon gate layer 7, the P type region 23 and the N type region 24. Superimposed over the first metal layer 25, a layer 26 of passivating material, e.g., phosphosilicate glass, is etched to expose portions 27 and 28 of the first metal layer 25, which represent bonding areas for the chip.

A second metal layer 29, deposited over the entire surface of the chip, contacts the underlying first metal layer 25 in correspondence with the uncovered portions 27 and 28. After the selective etching of the second metal layer 29, wires 30 and 31 are bonded to it in correspondence with the bonding areas.

The thickness of the first metal layer 25 is determined by the required components integration density. The second metal layer 29 is thicker than the first metal layer 25, so that during the bonding of wires 30 and 31 the first metal layer 25 is not perforated, thus allowing the bonding directly over the active area regions, and not affecting the components' integration density.

It is also possible without changing the process steps, but only the layout of the intermetal dielectric mask, to improve the reliability of the bonding.

FIG. 3 shows again the power MOSFET of FIG. 1. The only difference with respect to FIG. 1 are the two islands 32 of passivating material, obtained during the etching of the layer 13 (step (d)) by using a mask with a different layout with respect to the one used in the case of FIG. 1. Such islands generate a roughening of the surface of the second metal layer 16, thus increasing the friction between the bonding wire 18 and the surface of the second metal layer 16 during the bonding step. This improves the adherence of the bonding wire, and the device is thus made more reliable. In a preferred embodiment the islands 32 can be distributed over the bidimensional array of elementary cells 1 and separated by a distance corresponding to the diameter of the bonding wire 18.

Figure 3:
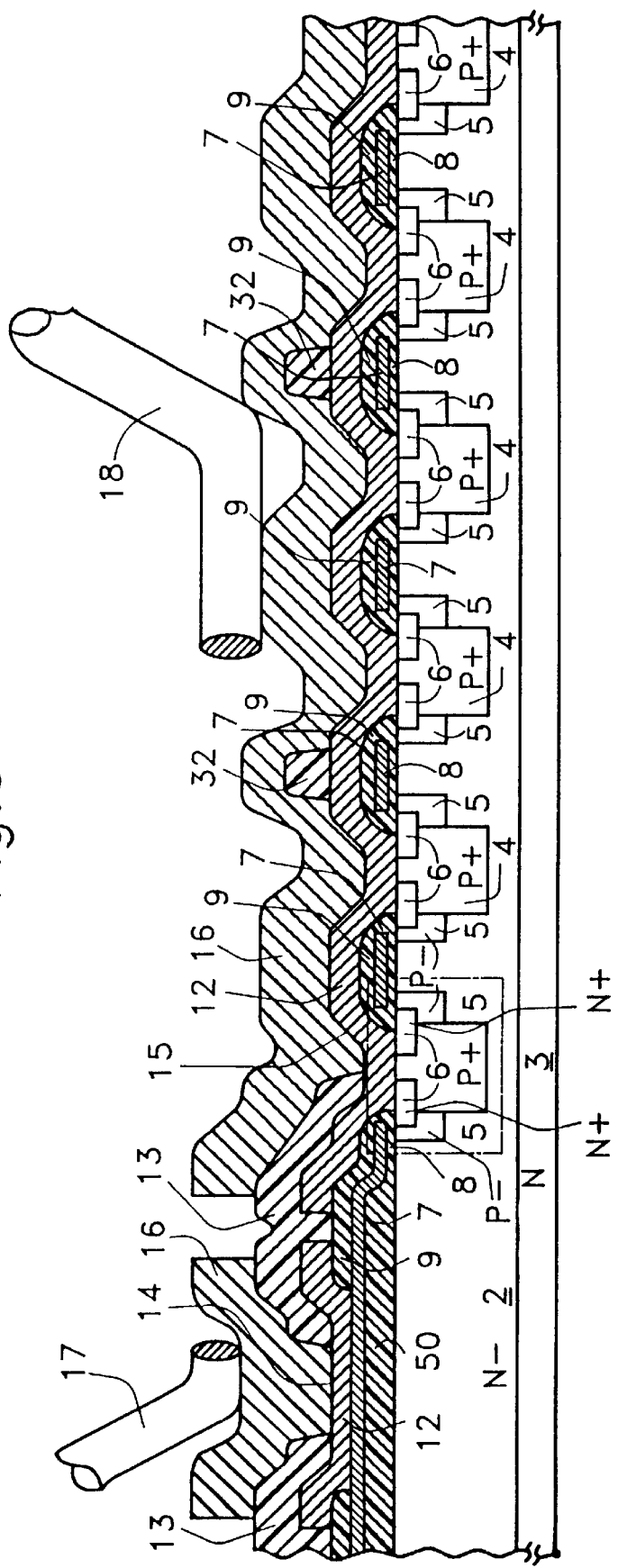
FIG. 3 is a cross-sectional view of the power MOSFET of FIG. 1, in which metallization and bonding have been carried out with a process according to another embodiment of the invention.
Figure 4:
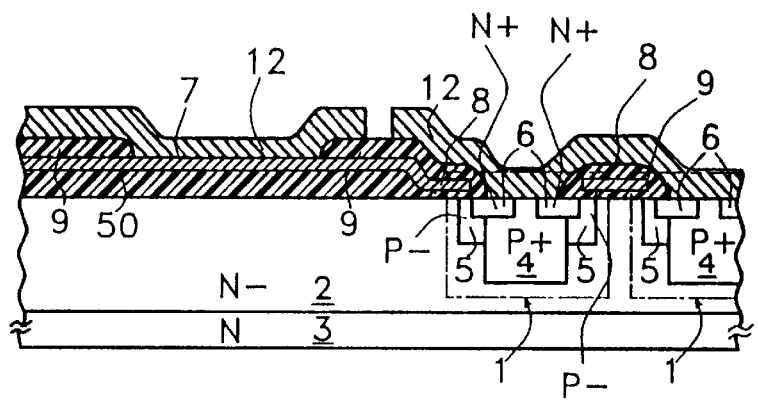
FIGS. 4–7 are cross-sectional views showing some of the steps of the process according to the invention, applied to the fabrication of the power MOSFET of FIG. 1.
Figure 5:
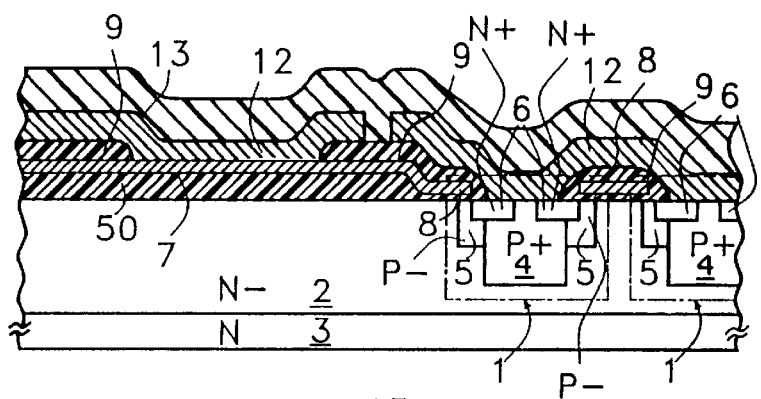

In FIG. 3, no islands of passivating material are provided in the bonding region 14 of the bonding wire 17 because this is connected to the gate electrode and must conduct smaller currents with respect to the wire 18, connected to the source of all the elementary cells 1. The wire 17 has therefore a smaller diameter, and its bonding to the surface of the second metal layer 16 is consequently less critical.

It is evident to anyone skilled in the art that the process according to the invention is not limited in its application to power MOSFETs or PICs, but can be employed in the manufacturing of any other power semiconductor device, such as Insulated Gate Bipolar Transistors (IGBTs).

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A bonding pad for a semiconductor device having active regions interconnected by a metal pattern, the bonding pad comprising:

a metal region disposed over the metal pattern, the metal region defining a bonding pad area over the active regions, the metal region being in direct contact with the metal pattern for substantially the whole bonding pad area, a thickness of the metal region preventing perforation of the metal region by a bonding wire during a bonding process of bonding the bonding wire to the metal region so that a mechanical stress caused by the bonding wire during the bonding process is substantially entirely sustained by the metal region; and a passivating material layer disposed between the metal pattern and the metal region except for under said bonding pad area defined by the metal region.

2. The bonding pad according to claim 1, wherein said bonding pad area includes islands of passivating material provided between the metal pattern and the metal region to cause the metal region to have a rough surface, the islands of passivating material each having an area substantially smaller than the bonding pad area so that the metal region is in direct contact with the metal pattern for substantially the whole bonding pad area.

3. The bonding pad according to claim 1 wherein at least one of the metal region and the metal pattern is composed of an alloy of aluminum, silicon and titanium.

4. The bonding pad according to claim 1 wherein at least one of the metal region and the metal pattern is composed of an alloy of aluminum, silicon and copper.

5. The bonding pad according to claim 1 wherein the thickness of the metal region is greater than a thickness of the metal pattern.

6. A bonding pad for a semiconductor device having active regions interconnected by a metal pattern, the bonding pad comprising:

a metal region disposed over the metal pattern, the metal region defining a bonding pad area over the active regions, the metal region being in direct contact with the metal pattern for substantially the whole bonding pad area, a thickness of the metal region preventing perforation of the metal region by a bonding wire during a bonding process of bonding the bonding wire to the metal region so that a mechanical stress caused by the bonding wire during the bonding process is substantially entirely sustained by the metal region; and a passivating material layer, comprising a dielectric, disposed between the metal pattern and the metal region except for under said bonding pad area defined by the metal region;

whereby the passivating material layer operates both to separate the metal pattern from the metal region, except for under the bonding pad area, and to protect a surface of the semiconductor device.

\* \* \* \* \*